United States Patent [19]
Moon et al.

[11] Patent Number: 5,719,085
[45] Date of Patent: Feb. 17, 1998

[54] SHALLOW TRENCH ISOLATION TECHNIQUE

[75] Inventors: Peter K. Moon, Portland; Berni W. Landau, Beaverton; David T. Krick, Hillsboro, all of Oreg.

[73] Assignee: Intel Corporation, Santa Clara, Calif.

[21] Appl. No.: 536,694

[22] Filed: Sep. 29, 1995

[51] Int. Cl.$^6$ ................................................ H01L 21/76
[52] U.S. Cl. .................. 438/424; 438/435; 438/437; 438/296; 148/DIG. 50
[58] Field of Search ............ 437/67, 72; 148/DIG. 50; 438/424, 435, 437, 296

[56] References Cited

U.S. PATENT DOCUMENTS

| | | | |
|---|---|---|---|
| 4,073,054 | 2/1978 | Kaji et al. | 437/68 |
| 4,506,434 | 3/1985 | Ogawa et al | 437/67 |
| 5,100,822 | 3/1992 | Mitani | 437/52 |
| 5,258,332 | 11/1993 | Horioka et al. | 437/67 |
| 5,453,395 | 9/1995 | Water Lur | 437/67 |
| 5,455,194 | 10/1995 | Vasquez et al. | 437/67 |
| 5,578,518 | 11/1996 | Koike et al. | 437/67 |

FOREIGN PATENT DOCUMENTS

0117243  9/1980  Japan .................................. 437/72

*Primary Examiner*—Trung Dang
*Attorney, Agent, or Firm*—Blakely, Sokoloff, Taylor & Zafman

[57] ABSTRACT

A method of forming a trench isolation region. The method of the present invention comprises the steps of forming an opening in a semiconductor substrate, oxidizing the opening a first time, and then etching the oxidized opening with a wet etchant comprising HF. The opening is then oxidized a second time.

19 Claims, 7 Drawing Sheets

SHALLOW TRENCH ISOLATION TECHNIQUE

BACKGROUND OF THE INVENTION

1. Field of the Invention

The present invention relates to methods of fabricating semiconductor integrated circuits and more particularly to a method of forming a shallow trench isolation region in a semiconductor substrate.

2. Discussion of Related Art

Modern integrated circuits are made up of literally millions of individual devices such as transistors and capacitors formed in a single semiconductor substrate such as a silicon substrate. The individual devices are electrically isolated from one another through the use of various isolation techniques such as, local oxidation of silicon (LOCOS), recessed LOCOS and trench isolation.

Figure 1:
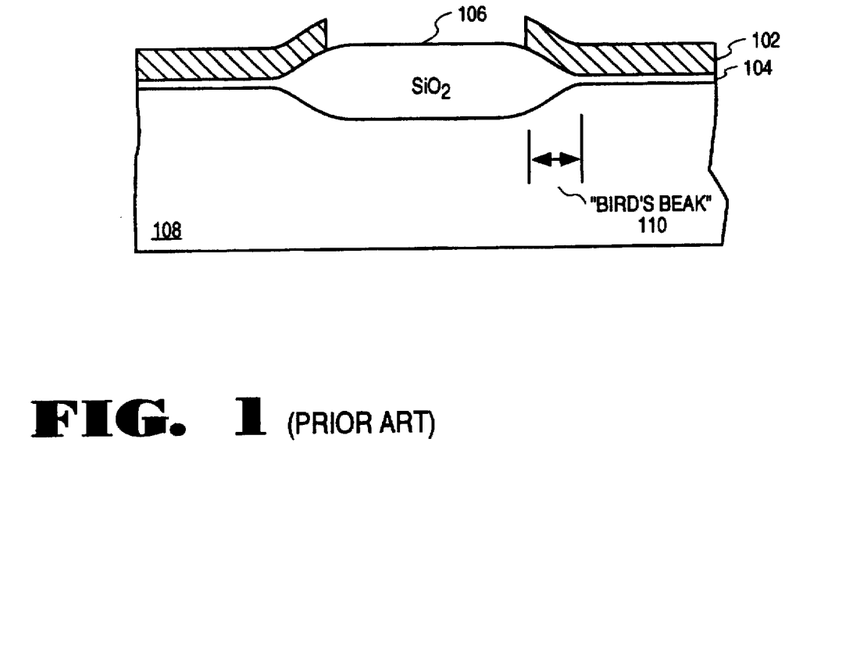
FIG. 1 is an illustration of a cross-sectional view of a prior art LOCOS isolation structure.

LOCOS isolation processes are the most widely used techniques for isolating metal oxide semiconductor device (MOS) devices. A typical LOCOS isolation region is shown in FIG. 1. In a LOCOS isolation process, a silicon nitride mask 102 and pad oxide layer 104 are used to selectively grow field isolation regions 106 (i.e. field oxide regions) in a silicon substrate 108. The silicon nitride mask prevents oxidation of the silicon substrate where active devices are to be formed. A problem with LOCOS isolation techniques is that the oxidation step consumes substantial amounts of silicon adjacent to the isolation regions. This phenomenon generates what's known as a "bird's beak" 110. An advantage of the "bird's beak" is that it helps reduce the leakage current ($I_{off}$) of adjacent transistors. A problem with creating a "bird's beak", however, is that the dimensions of the isolation region 106 are increased and therefore the amount of silicon available for active devices is reduced (i.e. reduces device packing density). Another shortcoming with LOCOS isolation techniques is that approximately 45% of the isolation region 106 is grown above the silicon substrate 108 resulting in a non-planar topography which can adversely affect downstream processing steps such as photolithography. For these reasons, LOCOS processes are not well suited for the manufacture of modern ultra large scale integrated (ULSI) circuits.

Recessed LOCOS isolation structures are similar to LOCOS isolation structures except that a groove or recess is etched into the silicon substrate prior to the oxidation step. The oxidation step then grows an oxide in the etched space and thereby forms a relatively planar isolation region. Recessed LOCOS processes, however, still suffer to some degree from non-planar topographies and lateral encroachment due to bird's beak formation.

Figure 2:
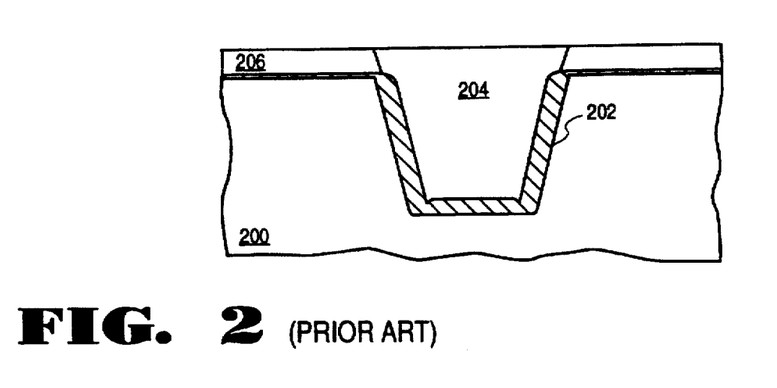
FIG. 2 is an illustration of a cross-sectional view of prior art trench isolation structure.

Another isolation technique which has recently received a great deal of attention is trench isolation. In a trench isolation process, a trench or groove is first etched into a silicon substrate 200 as shown in FIG. 2. Next, an oxide layer is selectively grown on the sidewalls of the trench using a silicon nitride mask 206. An oxide layer or other fill material is then blanket deposited over the substrate and into the trench to refill the trench. The deposited oxide is then etched back to form an isolation structure which is substantially planar with the silicon substrate.

Trench isolation processes are preferred over LOCOS processes because they require less substrate area than do LOCOS processes and so therefore allow for the fabrication of higher density integrated circuits. Additionally, trench isolation processes typically produce isolation structures with planar topographies which improve subsequent processing such as photolithography.

A problem associated with present trench isolation techniques is that their unusual geometry and doping profile create a substantial amount of transistor source-drain leakage current ($I_{off}$). That is, with present trench isolation formation techniques, a low resistance pathway is created at the diffusion/isolation transistor edge allowing a significant amount of current to leak from the source to the drain when the transistor is off (i.e. when the channel is in a nonconductive state). Transistor leakage current must be minimized in order to control the standby current in a fabricated integrated circuit.

Thus, what is needed is a method of fabricating a trench isolation structure wherein the source-drain leakage current is substantially reduced.

SUMMARY OF THE INVENTION

The present invention describes a method of forming a shallow trench isolation structure in a silicon substrate. According to a preferred embodiment of the present invention, a pad oxide layer is formed on a silicon substrate and a silicon nitride layer is formed on the pad oxide layer. Next, a trench is etched through the silicon nitride layer, the pad oxide layer, and into the silicon substrate so as to form a trench with sloped sidewalls in the silicon substrate. The trench is then wet etched with an etchant comprising HF so as to etch away a portion of the pad oxide layer from beneath the silicon nitride layer to thereby expose a portion of the top surface of the silicon substrate adjacent to the trench. Next, the trench is oxidized a first time so as to grow an oxide layer on the trench sidewalls and on the revealed top portion of the silicon substrate adjacent to the trench. Next, the grown oxide layer is etched away from the trench sidewalls and from the top portion of the silicon substrate with a wet etchant comprising HF. Next, the sidewalls of the trench and the portion of the silicon substrate adjacent to the trench are oxidized a second time to form a second grown oxide layer thereon. Finally, a trench fill material is deposited into the trench and planarized with respect to the silicon nitride layer to form a shallow trench isolation structure with a planar topography. The trench isolation structure of the present invention substantially eliminates adjacent transistor leakage currents and forms uniform high density void free isolation regions.

BRIEF DESCRIPTION OF THE DRAWINGS

FIG. 3b is an illustration of a cross-sectional view showing the formation of a trench in the substrate of FIG. 3a.

DETAILED DESCRIPTION OF THE PRESENT INVENTION

The present invention discloses a novel method of fabricating a shallow trench isolation structure. In the following description, numerous specific details such as specific process steps, materials, and dimensions, etc. are set forth in order to provide a thorough understanding of the present invention. It will be obvious, however, to one skilled in the art that the present invention may be practiced without these specific details. In other instances, well known integrated circuit manufacturing steps and equipment have not been set forth in detail in order to not unnecessarily obscure the present invention.

The present invention provides a novel method of fabricating a shallow trench isolation (STI) structure which can be used to isolate individual transistors formed in a semiconductor substrate and can also be used to isolate P wells and N wells if desired. The method of the present invention forms void free, high density trench isolation structures with planar topographies. The method of the present invention provides a trench isolation structure wherein the leakage current ($I_{off}$) of adjacent transistors is substantially reduced or eliminated [i.e. reduces the amount of current ($I_{off}$) which flows from the source to the drain when the transistor is off].

Figure 3A:
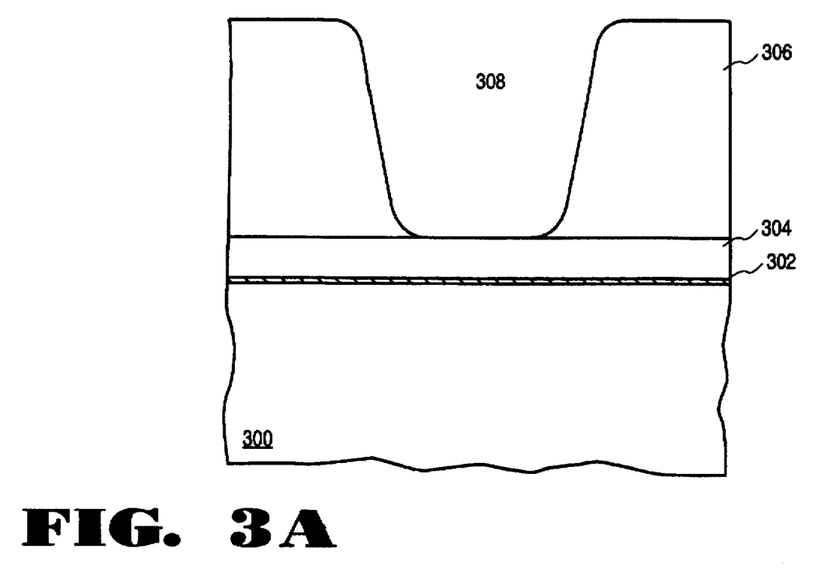
FIG. 3a is an illustration of a cross-sectional view of a semiconductor substrate having a pad oxide layer, a semiconductor silicon nitride layer, and a photoresist layer formed thereon.

According to the method of the present invention, a semiconductor substrate 300 is provided in which active devices of an integrated circuit will eventually be formed. Semiconductor substrate 300 is preferably single crystalline silicon but may be or may include other types of semiconductor materials including, but not limited to, gallium arsenide and germanium. Additionally, semiconductor substrate 300 may include an epitaxial layer or layers if desired. Sail further, semiconductor substrate 300 may include an oxide layer in the case of silicon on insulator processes (SOI) or a sapphire layer in the case of silicon on sapphire (SOS) processes. According to the preferred embodiment of the present invention, substrate 300 comprises a bulk silicon layer with a silicon epitaxial layer formed thereon.

The first step of the present invention as shown in FIG. 3a, is to form a thin pad oxide layer 302 on silicon substrate 300. Pad oxide layer 302 is used to relieve stress between silicon substrate 300 and a subsequently formed silicon nitride layer. According to the preferred embodiment of the present invention an approximately 100 Å±10 Å thick pad oxide layer is grown on substrate 300. The thickness of pad oxide layer 302 is chosen to provide the proper final trench dimensions with a small reproducible bird's beak at shallow trench oxidation. Additionally, pad oxide layer 302 is preferably formed thick enough to provide an etch stop for a subsequent silicon nitride removal step. According to the preferred embodiment of the present invention, pad oxide layer 302 is grown in an oxygen and dichloroethylene (DCE) ambient in a Kokusai Vertron III vertical diffusion furnace at approximately 900° C. The use of DCE helps provide a clean substrate by gettering metal contaminants from the silicon substrate 300. The metallic contaminants react with chlorine from the DCE to form gaseous metallic chlorides which are evacuated away. Any well known methods, however, can be used to form pad oxide layer 302 if desired.

Next, a uniform layer of silicon nitride 304 is formed on pad oxide layer 302. Silicon nitride layer 304 provides an oxidation barrier for a subsequent shallow trench oxide growth and also provides a "polish stop" for a subsequent shallow trench planarization step. According to a preferred embodiment of the present invention, an approximately 1800 Å±200 Å, silicon nitride layer is formed on pad oxide 302. The thickness of silicon nitride layer 304 is chosen to ensure that after shallow trench planarization, the silicon surface on which the gate oxide is to be grown will be lower than the trench fill material. Silicon nitride layer 304 can be formed by any method well known in the art. It is to be appreciated that other suitable oxidation resistant masking materials or combination of materials may be used in place of a silicon nitride layer 304 and pad oxide layer 302 if desired.

Next, according to the present invention, a photoresist layer 306 is deposited over silicon nitride layer 304. The photoresist layer is then masked, exposed and developed to define locations 308 in photoresist layer 306 where trench isolation regions are to be formed. With the novel method of the present invention, narrow high density isolation regions (less than 4000 Å wide) can be uniformly formed across the surface of a wafer. The method of the present invention can form trench isolation regions whose dimensions are only limited by photolithographic limitations. Additionally, with the present invention large dimension (wide) trenches can also be formed simultaneously with narrow trenches without detrimentally affecting the processing of the narrow trenches and vice versa.

Figure 3B:
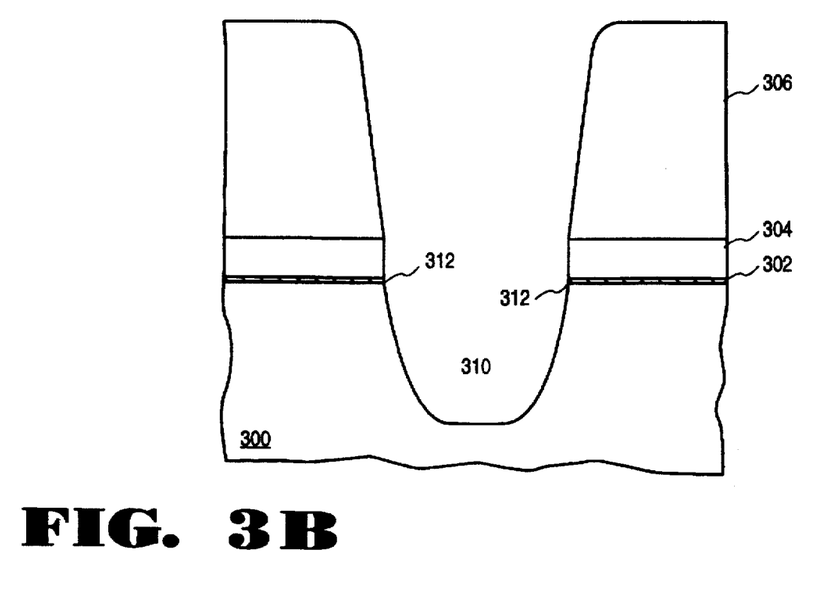

The next step, according to the present invention, is to etch a trench 310 through nitride layer 304 pad oxide layer 302 and into silicon substrate 300 as shown in FIG. 3b. Trench 310 is preferably etched deep enough to provide punchthrough isolation, but yet not too deep to cause marginal gap filling and increased stress. Additionally, the sidewalls of trench 310 are preferably slightly sloped (approximately 80 degrees) to facilitate subsequent trench filling without forming gaps or voids therein. Additionally, according to the preferred embodiment of the present invention, after etching corners 312 (trench/substrate) of trench 310 are at approximately right angles. It is important not to form corners with acute angles (<90°) because such sharp corners result in high electric fields which cause undesired leakage current. Any well known etching techniques can be used to etch through silicon nitride layer 304 and pad oxide layer 302. The silicon portion of the etch is preferably accomplished utilizing a LAM Rainbow 4000 etcher with a chlorine based chemistry. The silicon etching is timed to form a trench at the desired depth.

After trench 310 has been etched to the desired depth, photoresist layer 306 is stripped with well known techniques such as plasma ashing.

Figure 3C:
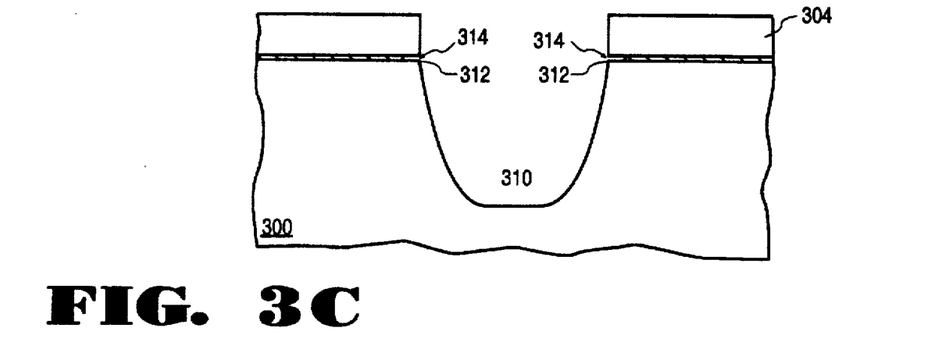
FIG. 3c is an illustration of a cross-sectional view showing the result of a first trench wet etch of the substrate of FIG. 3b.

The next step, according to the present invention, is to expose trench 310 to a first trench wet etch. According to the preferred embodiment of the present invention, trench 310 is exposed to a wet etchant comprising hydrofluoric acid (HF). As shown in FIG. 3c, by exposing trench 310 to a wet etch comprising HF, the portion of pad oxide layer 302 surrounding trench 310 is removed to reveal the portion 314 of the top surface of silicon substrate 300 adjacent to trench corner 312. (It is to be appreciated that silicon substrate 300 and silicon nitride layer 304 are substantially immune to HF etchants allowing for the etching of only pad oxide layer 302). The use of a wet etch allows the etchant to undercut the silicon nitride layer and etch the pad oxide layer in the small gap created between silicon substrate 300 and silicon nitride layer 304. The goal of the first trench wet etch is to remove a portion of the pad oxide layer 302 to expose the top surface of silicon adjacent to corner 312 of trench 310 so that during a subsequent oxidation step, oxidation can occur in two directions resulting in a rounding of the corner 312 of trench 310 to help reduce leakage current ($I_{off}$). The first trench wet etch should remove enough pad oxide in order to allow subsequent two-dimensional oxidation of the trench corner, but not remove too much pad oxide so that the trench dimensions are substantially increased. It has been found that removing approximately 300 Å (laterally) of pad oxide adjacent to trench 310 provides good results. The preferred method of the present invention utilizes a wet etchant comprising 50:1 water to HF for approximately 140 seconds followed by a rinse in deionized (DI) water.

Figure 3D:
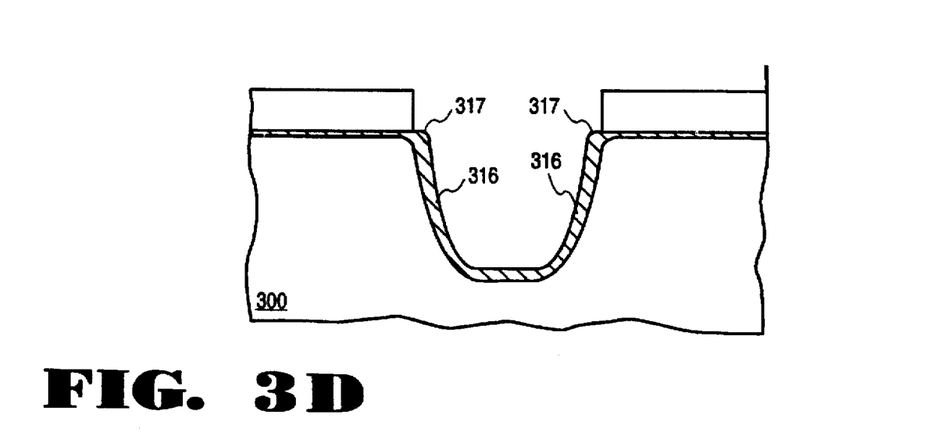
FIG. 3d is an illustration of a cross-sectional view showing the growth of a first oxide layer on the substrate of FIG. 3c.

Next, as shown in FIG. 3d, trench 310 is oxidized a first time to form a first trench oxide 316. Trench oxide 316 is grown on the sidewalls and on the bottom of trench 316 as well as on the top portion 314 of substrate 300. Because surface portion 314 of silicon substrate 300 is exposed, oxidation of corner 312 occurs in two directions, resulting in a rounding of corner 312. The first trench oxidation step regrows the portion of pad oxide 302 which was etched away during the first trench wet etch step. The first oxidation step grows a first trench oxide 316 with a small controlled "bird's beak" 317. By rounding the corners of trench 310 and forming a bird's beak 317, the leakage current ($I_{off}$) of adjacent transistors is greatly reduced. Additionally, any dangling bonds left from the trench etch are transformed from broken bonds to silicon dioxide bonds during the first oxidation step. Transforming the broken bonds to silicon dioxide is thought to help reduce transistor leakage current. According to a preferred embodiment of the present invention, first trench oxidation grows an approximately 200–400 Å thick high quality oxide in a Kokusai Vertron III vertical diffusion furnace at approximately 920° C. utilizing an oxygen/DCE ambient with an approximately 9% HCl to $O_2$ equivalency.

Figure 3E:
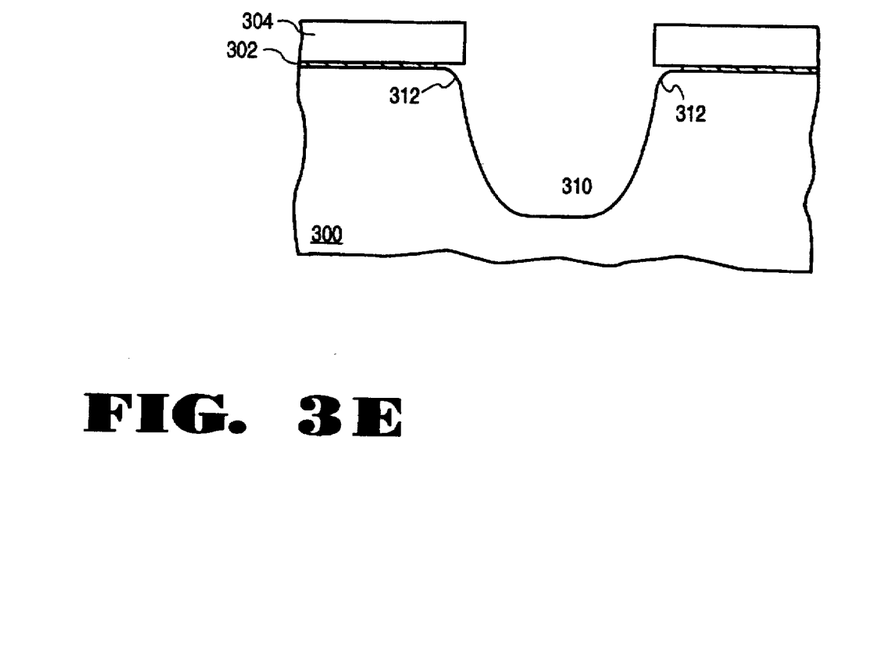
FIG. 3e is an illustration of a cross-sectional view showing the result of a trench wet etch of the substrate of FIG. 3d.

The next step, according to the present invention, is to expose trench 310 to a second trench wet etch. According to a preferred embodiment of the present invention, trench 310 is exposed to a second wet etch comprising hydrofluoric acid (HF). As shown in FIG. 3e, the second trench wet etch removes first trench oxide 316 from the bottom and sidewalls of trench 310 as well as the oxide from the top surface of silicon substrate 300 surrounding trench 310. The second trench wet etch removes the bird's beak formed during the first wet etch/oxidation steps to once again expose trench corner 312. The second trench wet etch also removes an approximately 200 Å of additional pad oxide 302 that was not removed during the first trench wet etch (total of 500 Å laterally is removed). Like the first trench wet etch, the goal of the second trench wet etch is to reveal the portion of silicon substrate 300 adjacent to corners 312 so that a subsequent oxidation can occur in two dimensions allowing for further rounding of corner 312. In a preferred embodiment of the present invention, the second wet etch is carried out in a 50:1 $H_2O$ to HF solution for approximately 280 seconds followed by a rinse in deionized water.

Figure 3F:
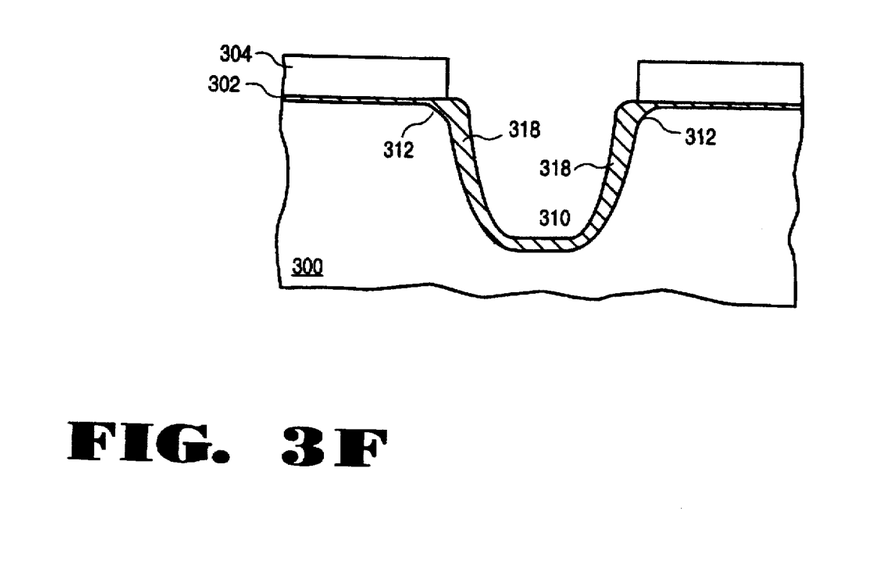
FIG. 3f is an illustration of a cross-sectional view showing the growth of an oxide layer on the substrate of FIG. 3e.

The next step according to the preferred embodiment of the present invention is to oxidize trench 310 a second time to grow a second trench oxide 318. The second trench oxidation step grows an approximately 400–500 angstrom thick oxide on the trench sidewalls and on the top surface of silicon substrate 300. Because the portion of silicon substrate surrounding trench 310 is uncovered, the second oxidation step further rounds corner 312 and forms a small "bird's beak." The second oxidation preferably forms approximately 400–500 angstroms of oxide over corners 312 of trench 310. [It is to be noted that the second oxidation forms slightly more oxide on the top of the trench sidewalls (400–500 angstroms) than on the bottom sidewalls (200–300 angstroms) due to the structure of trench 310]. Not only does the second oxidation provide for further rounding of the trench corners, but it also provides a clean layer between silicon substrate 300 and a subsequently deposited trench fill layer.

Figure 3G:
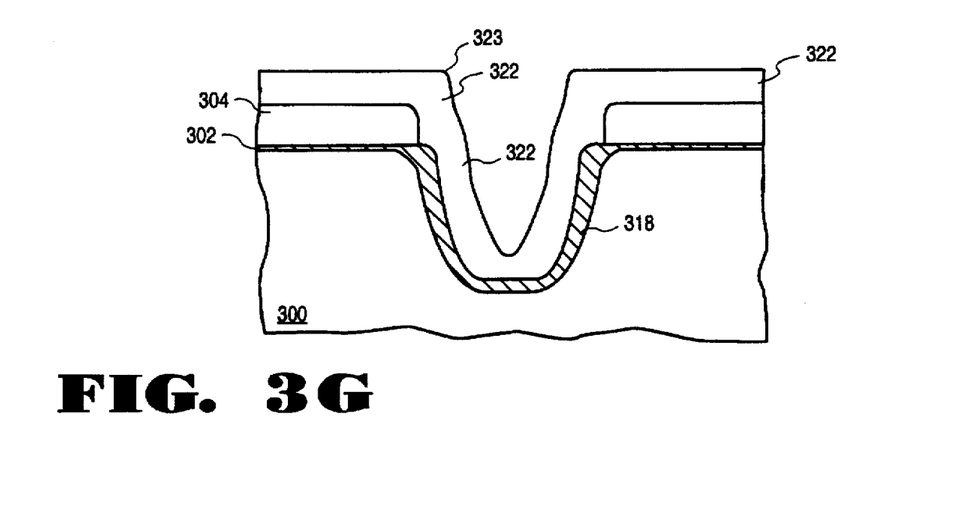
FIG. 3g is an illustration of a cross-sectional view showing the deposition of a first oxide layer on the substrate of FIG. 3f.

The next step according to the present invention is to fill trench 310 with a fill material that will electrically isolate the individual transistors. According to a preferred method of the present invention, trench 310 is first filled, as shown in FIG. 3g, with an approximately 1000 Å oxide layer 322 blanket deposited over nitride layer 304 and into trench 310. In a preferred method, oxide layer 322 can be formed by plasma enhanced chemical vapor deposition (PECVD) in an AMAT 5000 single wafer machine utilizing tetraethylorthosilicate (TEOS) and $O_2$ reactant gases. Prior to the formation of oxide layer 322 it may be desirable to expose the trench oxide to a nitrogen plasma in a AMAT passivation tool. This preconditioning step is thought to help prevent the formation of dislocations in the silicon by transforming the surface of the trench oxide to a oxynitride.

Figure 3H:
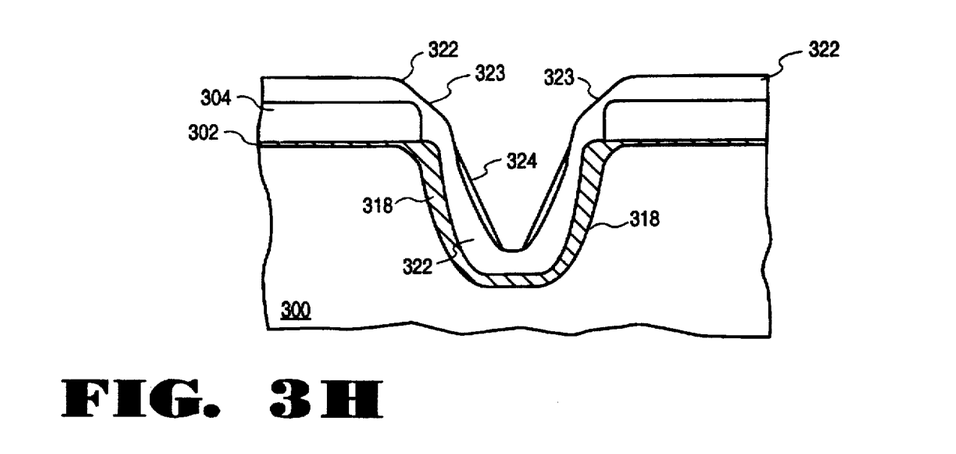
FIG. 3h is an illustration of a cross-sectional view showing the sputter etching of the substrate of FIG. 3g.
Figure 3I:
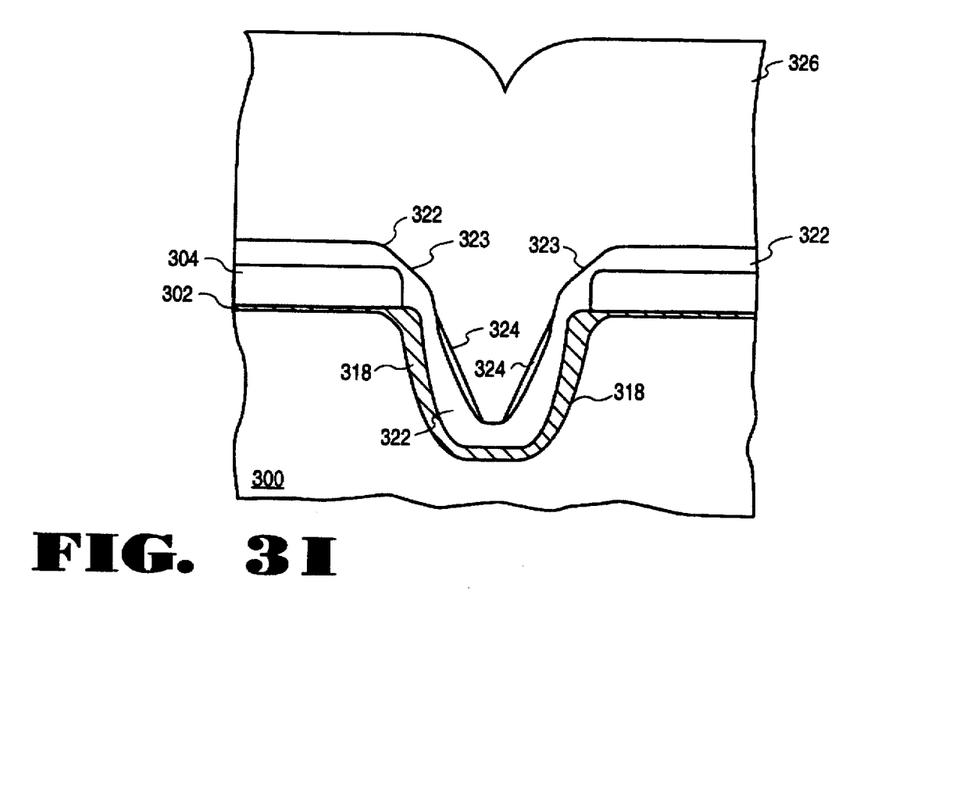
FIG. 3i is an illustration of a cross-sectional view showing the deposition of a second oxide layer on the substrate of FIG. 3h.

Next, shown in FIG. 3h, deposited layer 322 is in-situ sputter etched with an argon sputter etch. During the sputter etch, approximately 400 Å of the top oxide layer 322 is removed. Additionally, oxide sputtered off the corners and sidewalls of the trench is redeposited 324 in the lower corners of the trench. This sputter etch improves (decreases) the sidewall angles of the trench and also rounds the corners 323 of oxide layer 322. Both the rounding of corners 323 and decreasing of sidewall angles enhances trench filling. Next, a second PECVD oxide layer 326 is deposited over sputter etch oxide layer 324 to thereby complete filling of trench 310. Second oxide layer 326 must be at least thick enough to fill from the bottom to the top the widest trench formed in substrate 300. Second oxide layer 326 is preferably formed to a thickness of approximately 5000–7000 Å by a PECVD process in an AMAT 5000 machine utilizing TEOS and $O_2$ source gases. At this time, if desired, substrate 300 can be annealed by methods well known in the art to densify deposited oxide layers 322 and 326.

It is to be appreciated that other well known materials and methodologies can be used to fill trench 310 if desired. The dep-etch-dep process, however, is preferred because such a method can uniformly and consistently fill small dimensional trenches across the surface of a wafer without creating gaps or voids therein.

Figure 3J:
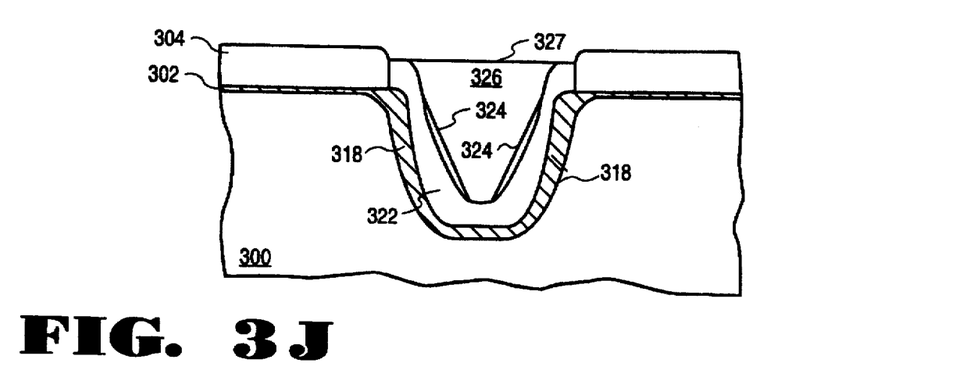
FIG. 3j is an illustration of a cross-sectional view showing the polishing of the substrate of FIG. 3i.

Next, as shown in FIG. 3j, deposited oxide layers 326 and 324 are chemically mechanically polished back to remove oxide layers 326 and 324 from the silicon nitride layer 304 to form a trench isolation structure with a planar topography 327 which is substantially coplanar with silicon nitride layer 304. Silicon nitride layer 304 is preferably used as a polish stop during the chemical mechanical polishing of oxide layers of 324 and 326. That is the preferred embodiment of the present invention utilizes a polishing process which is more selective to oxides than to silicon nitride. Because oxides 324 and 326 polish at a faster rate than silicon nitride layer 304, the top surface 327 of the trench isolation structure is typically slightly recessed beneath the top surface of silicon nitride layer 304 due to over polishing. Any well known and suitable chemical mechanical polishing process, however, can be used in the present invention such as, but not limited to, chemical mechanical polishing with a Westech 372M polisher and a slurry comprising potassium hydroxide and silica. Although polishing is preferred because of its excellent planarity, other well known planarization techniques such as etch back, may be utilized to remove oxide layers 326 and 324 if desired.

Figure 3K:
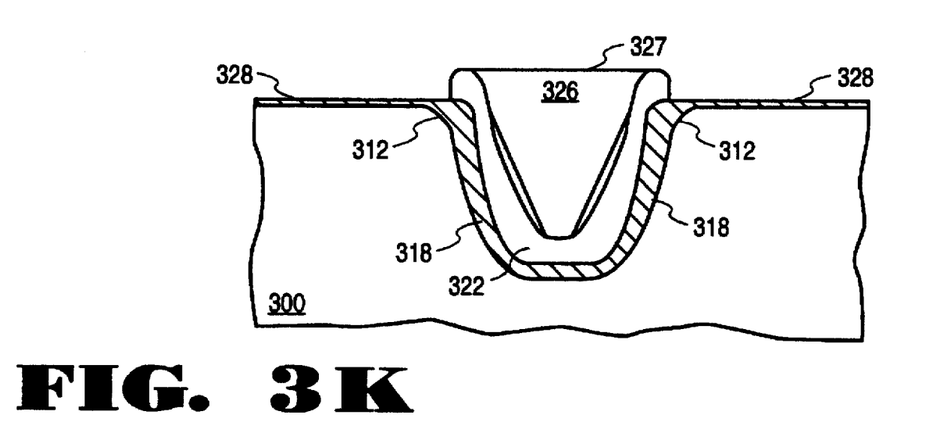
FIG. 3k is an illustration of a cross-sectional view showing the removal of the nitride layer and pad oxide layer from the substrate of FIG. 3j and the formation of a gate oxide layer.

The next step according to the present invention is to remove silicon nitride layer 304. Preferably pad oxide layer 304 is used as an etch stop for the silicon nitride removal step. Silicon nitride layer 304 can be removed using any well known technique such as etching with a hot phosphoric acid. The nitride etch removes the nitride from the active regions of silicon substrate 300. A small fraction of pad oxide 302 and CVD oxides 326 and 322 are removed during the nitride removal step.

At this time, various implants and dopings may be made into substrate 300 in order to form wells, and or adjust threshold voltages, etc. Pad oxide layer 302 can be used to protect silicon substrate 300 during these implants.

Next, according to the preferred embodiment of the present invention, pad oxide layer 302 is stripped from silicon substrate 300 to expose a clean, bare silicon surface over the active regions of silicon substrate 300. Pad oxide layer 302 is preferably etched away with a 50:1 HF dip followed by a standard clean. The HF dip etches off all of the thermal pad oxide (approximately 100 Å from silicon substrate 300, but only a minimal amount (approximately 150 Å) of the 500 Å of trench oxide formed over trench corner 312. It is to be stressed that care must be taken not to overetch during the pad oxide removal so as to leave a portion, about 300 Å, of the trench oxide bird's beak formed during trench oxidation.

After the removal of pad oxide layer 302, silicon substrate 302 is cleaned and prepared for the formation of a clean high quality gate oxide layer which is approximately 50–75 angstroms thick. Gate oxide layer 328 can be formed by any well known technique, such as described in U.S. Pat. No. 5,244,843 which is assigned to the present Assignee, or other techniques such as described in co-pending application entitled Manufacturable Dielectric Formed Using Multiple Oxidation and Anneal Steps by Chau, et al. filed on and given Ser. No. , and assigned to the present Assignee. It is to be noted that during the growth of gate oxide layer 328, the thickness of exposed trench oxide layer 318 also increases a like amount. The result is the formation of a thin gate oxide layer, with a thicker (approximately 3–4 times thicker) trench oxide layer adjacent to the gate oxide layer.

At this time, various well known semiconductor processes such as polygate formation and source/drain dopings are used to complete the fabrication of adjacent transistors. Next, well known interconnection techniques are used to join the isolated transistors into a functional integrated circuit such as a microprocessor or memory device.

The method of the present invention forms a high density trench isolation structure wherein source/drain leakage current is substantially reduced. The leakage current has been reduced through the use of successive "etch" and "oxidation" steps to round the trench corner 312 and to form a small controllable bird's beak. Rounding trench corners 312 reduces the high electric field normally associated with sharp corners. A reduction in electric field at corners 312 reduces the leakage current of adjacent devices. Additionally, by controllably forming a small bird's beak over corners 312, the result is essentially a thicker gate oxide layer over corner 312. By increasing the thickness of the gate oxide layer over corner 312, the electric field across the gate oxide layer in this area (trench corner) is reduced resulting in a further reduction of the leakage current for adjacent devices.

Although the preferred embodiment of the present invention utilizes a multi-step wet etch-oxidation-wet etch-oxidation technique to round trench corners 312 and to controllably form a bird's beak, it is expected that one can utilize portions of the preferred process flow to obtain some corner rounding and bird's beak formation to reduce transistor leakage current. For example, one can eliminate the first trench wet etch if desired and utilize only a first trench oxidation, a first wet etch followed by a second trench oxidation to round corner 312 and to grow a small bird's beak. Such a technique is expected to obtain some of the benefits obtained with applicant's total process and thereby reduce to some degree the leakage current. Additionally, if desired, one can utilize only the first trench wet etch followed by a single trench oxidation step to obtain some corner rounding and growth of a bird's beak to reduce to some degree the leakage current. Additionally, it is expected that one could add additional etch-oxidation steps than those described herein to obtain even further rounding and manipulation of trench corner 312. However, such processes would suffer from additional cost and poor throughput. Applicant has found that the novel wet etch-oxidation-wet etch-oxidation process of the preferred embodiment of the present invention provides the most economically manufacturable contouring of trench corner 312 and reduction of leakage current for manufacturing price.

In the foregoing specification, the invention has been described with reference to specific exemplary embodiments. It will, however, be evident that various modifications and changes may be made thereto without departing from the broader spirit and scope of the invention. For example, the present invention is not expected to be limited to the dimensions specifically described herein. Rather, it is expected that one can simply scale down the specific dimensions described herein to obtain even smaller trench isolation regions. The specifications and drawings are accordingly to be regarded in illustrative rather than a restrictive sense.

We claim:

1. A method of forming an isolation region in a semiconductor substrate comprising the steps of:

forming an opening in said semiconductor substrate;

etching said opening with a wet etchant;

oxidizing said opening a first time after etching said opening with said wet etchant;

etching said oxidized opening; and oxidizing said opening a second time.

2. The method of claim 1 further comprising the step of depositing an oxide layer in said oxidized trench after oxidizing said opening a second time.

3. The method of claim 2 wherein said step of depositing said oxide layer comprises the steps of:

depositing a first oxide layer into said oxidized trench;
sputter etching said first deposited oxide layer; and
depositing a second oxide layer over said sputter etch first oxide layer.

4. The method of claim 2 further comprising the step of polishing said deposited oxide layer to form an isolation region with a planar surface.

5. The method of claim 1 wherein said etching step utilizes a wet etchant.

6. The method of claim 4 wherein said wet etchant comprises HF.

7. The method of claim 1 wherein said first oxidizing step forms an oxide approximately 150 angstroms thick.

8. The method of claim 1 wherein second oxidation step produces a final oxide thickness of approximately 250–500 angstroms.

9. A method of forming a shallow trench isolation structure in a silicon substrate, said method comprising the steps of:
forming a pad oxide layer on a silicon substrate and a silicon nitride layer on said pad oxide layer;
etching a trench in said silicon nitride layer, said pad oxide layer, and said silicon substrate wherein said trench has sidewalls in said silicon substrate;
prior to oxidizing said trench, exposing said trench to a wet etchant comprising HF so as to etch away a portion of said pad oxide from beneath said silicon nitride layer to thereby expose a portion of the top surface of said silicon substrate;
oxidizing said trench a first time so as to grow an oxide layer on said trench sidewalls and on said revealed top portion of said silicon substrate;
after oxidizing said trench a first time, etching said grown oxide layer with a wet etchant comprising HF; and
oxidizing said trench a second time.

10. The method of claim 9 further comprising the step of:
depositing a trench fill material into said trench to fill said trench.

11. The method of claim 10 wherein said step of depositing said trench fill material comprises the steps of:
depositing a first oxide layer over said silicon nitride layer and into said oxidized trench;
sputter etching said first deposited oxide layer; and
depositing a second oxide layer over said sputter etch first oxide layer in said trench and on said silicon nitride layer.

12. The method of claim 10 further comprising the step of polishing said trench fill material to form a shallow trench isolation structure with a planarized surface.

13. A method of forming a trench isolation region in a silicon substrate comprising the steps of:
forming a trench in said silicon substrate;
depositing a first oxide layer into said trench;
sputter etching said first oxide layer so that said sputter etched first oxide layer redeposits in said trench; and
depositing a second oxide layer into said trench over said sputter etched first oxide layer.

14. The method of claim 13 further comprising the steps of:
after forming said trench and before depositing said first oxide layer, oxidizing said trench a first time;
etching said oxidized trench with a wet etch comprising HF; and
oxidizing said trench a second time.

15. The method of claim 13 further comprising the steps of:

before forming said trench, forming a pad oxide layer on said silicon substrate;
forming a silicon nitride layer over said pad oxide layer; and
after forming said trench and before depositing said first oxide layer, wet etching said trench a first time with a wet etching comprising HF so as to etch away a portion of said pad oxide beneath said silicon nitride layer to thereby expose a portion of the top surface of said silicon substrate; and
oxidizing said trench a first time so that to grow an oxide layer in said trench and on said revealed top portion of said silicon substrate.

16. The method of claim 15 further comprising the steps of:
after oxidizing said trench a first time, and before depositing said first oxide layer, etching said oxidized trench with a wet etchant comprising HF; and
oxidizing said trench a second time.

17. The method of claim 16 further comprising the steps of:
polishing said second oxide layer and said sputter etch first oxide layer from said silicon nitride layer to form a trench isolation structure which is substantially planar with said silicon nitride layer.

18. The method of claim 17 further comprising the steps of:
after polishing said first and second deposited oxide layers, removing said silicon nitride layer and said pad oxide layer so as to leave a bird's beak formed during said second oxidation step.

19. A method of forming a shallow trench isolation structure in a silicon substrate, said method of comprising the steps of:
forming a pad oxide layer on said silicon substrate and a silicon nitride layer on said pad oxide layer;
etching a trench in said silicon nitride layer, said pad oxide layer, and said silicon substrate wherein said trench has sloped sidewalls in said silicon substrate;
exposing said trench to a first wet etchant comprising HF so as to etch away a portion of said pad oxide from beneath said silicon nitride layer to thereby expose a portion of the top surface of said silicon substrate;
oxidizing said trench a first time so as to grow a first oxide layer on said trench sidewalls and on said revealed top portion of said silicon substrate;
etching said first grown oxide layer with a wet etchant comprising HF so as to remove said first grown oxide layer from said sidewalls of said trench and from said top portion of said silicon substrate; and
oxidizing said trench a second time so as to grow a second oxide layer on said trench sidewalls and on said top portion of said silicon substrate;
depositing a first oxide layer over said silicon nitride layer and into said oxidized trench;
sputter etching said first deposited oxide layer;
depositing a second oxide layer over said sputter etch first oxide layer in said trench and on said silicon nitride layer; and
polishing said second oxide layer and said sputter etch first oxide layer from said silicon nitride layer so as to form a trench isolation structure which is substantially planar to said silicon nitride layer.

* * * * *

UNITED STATES PATENT AND TRADEMARK OFFICE
CERTIFICATE OF CORRECTION

PATENT NO.   : 5,719,085
DATED        : February 17, 1998
INVENTOR(S)  : Moon et al.

It is certified that error appears in the above-identified patent and that said Letters Patent is hereby corrected as shown below:

In column 3 at line 52 delete "Sail" and insert --Still--

In column 7 at line 34 delete "dean" and insert --clean--

Signed and Sealed this

Ninth Day of June, 1998

Attest:

BRUCE LEHMAN

*Attesting Officer*            *Commissioner of Patents and Trademarks*